US010983446B1

(12) United States Patent
Lin (10) Patent No.: US 10,983,446 B1
(45) Date of Patent: Apr. 20, 2021

(54) CONTROL EQUIPMENT AND CONTROL METHOD OF STEPPER

(71) Applicant: UNITED MICROELECTRONICS CORP., Hsinchu (TW)

(72) Inventor: Chih-Ming Lin, Tainan (TW)

(73) Assignee: UNITED MICROELECTRONICS CORP., Hsinchu (TW)

( * ) Notice: Subject to any disclaimer, the term of this patent is extended or adjusted under 35 U.S.C. 154(b) by 0 days.

(21) Appl. No.: 16/691,894

(22) Filed: Nov. 22, 2019

(30) Foreign Application Priority Data

Oct. 21, 2019 (CN) .......................... 201910999042.3

(51) Int. Cl.
*G03F 7/20* (2006.01)
(52) U.S. Cl.
CPC ...... *G03F 7/70808* (2013.01); *G03F 7/70266* (2013.01); *G03F 7/70491* (2013.01); *G03F 7/70775* (2013.01)
(58) Field of Classification Search
CPC ............. G03F 7/70808; G03F 7/70266; G03F 7/70491; G03F 7/70775; G03F 7/20
See application file for complete search history.

(56) References Cited

U.S. PATENT DOCUMENTS

| | | | |
|---|---|---|---|
| 6,501,534 B1* | 12/2002 | Singh .................. | G03F 7/70516 355/53 |
| 7,103,439 B1* | 9/2006 | Bode ................ | G05B 19/41865 700/121 |
| 7,171,047 B2 | 1/2007 | Grinchuk et al. | |
| 7,749,666 B2 | 7/2010 | Gassner et al. | |
| 10,043,109 B1* | 8/2018 | Du ..................... | G06Q 30/0643 |
| 10,593,042 B1* | 3/2020 | Douillard ........... | G06K 9/00805 |
| 2019/0197359 A1* | 6/2019 | Haneda .................... | G06N 3/08 |

* cited by examiner

*Primary Examiner* — Vuthe Siek
(74) *Attorney, Agent, or Firm* — WPAT, PC (57) ABSTRACT

A control equipment and a control method of a stepper are provided. The control equipment of the stepper includes an input device, a generating device and a processing device. The input device is configured to input a plurality of sample development patterns. The sample development patterns are obtained according to a plurality of sample focal length values. The generating device is configured to generate a plurality of generative categories corresponding to a plurality of generative focal length values by using a depth learning algorithm. The processing device is configured to analyze an estimated focal length value of the online development pattern according to the generative categories.

20 Claims, 7 Drawing Sheets

CONTROL EQUIPMENT AND CONTROL METHOD OF STEPPER

This application claims the benefit of People's Republic of China application Serial No. 201910999042.3, filed Oct. 21, 2019, the subject matter of which is incorporated herein by reference.

BACKGROUND OF THE INVENTION

Field of the Invention

The invention relates in general to a control equipment and a control method, and more particularly to a control equipment and a control method of a stepper.

Description of the Related Art

Along with the development in the semi-conductor technology, various electronic devices are provided one after another. The manufacturing process of chip includes an exposure process, a development process, and an etching process. After a photoresist layer is exposed in an exposure process, a development pattern is shown in the development process. In an etching process, a metal layer is etched, by using the development pattern as a mask, to form a circuit layer.

Therefore, the precision of controlling the exposure process greatly affects the circuit layer. Conventionally, an operator can adjust the exposure energy of the stepper to precisely develop the development pattern. However, as the trace width is getting smaller and smaller, the stepper needs more accurate calibration to form high precision circuits.

SUMMARY OF THE INVENTION

The present invention relates to a control equipment and a control method of a stepper, which calibrates the beam focal length and/or the exposure energy of the stepper to increase the precision of the stepper by using the artificial intelligence technology.

According to an embodiment of the present invention, a control equipment of a stepper is provided. The control equipment of the stepper includes an input device, a generating device and a processing device. The input device is configured to input a plurality of sample development patterns. The sample development patterns are obtained according to a plurality of sample focal length values. The generating device is configured to generate a plurality of generative categories corresponding to a plurality of generative focal length values by using a depth learning algorithm. The processing device is configured to analyze an estimated focal length value of an online development pattern according to the generative categories.

According to another embodiment of the present invention, a control method of a stepper is provided. The control method of the stepper includes the followings steps. A plurality of sample development patterns are obtained according to a plurality of sample focal length values. A plurality of generative categories corresponding to a plurality of generative focal length values are generated by using a depth learning algorithm. An online development pattern is obtained. An estimated focal length value of the online development pattern is analyzed according to the generative categories.

The above and other aspects of the invention will become better understood with regards to the following detailed description of the preferred but non-limiting embodiment(s). The following description is made with reference to the accompanying drawings.

DETAILED DESCRIPTION OF THE INVENTION

Figure 1:
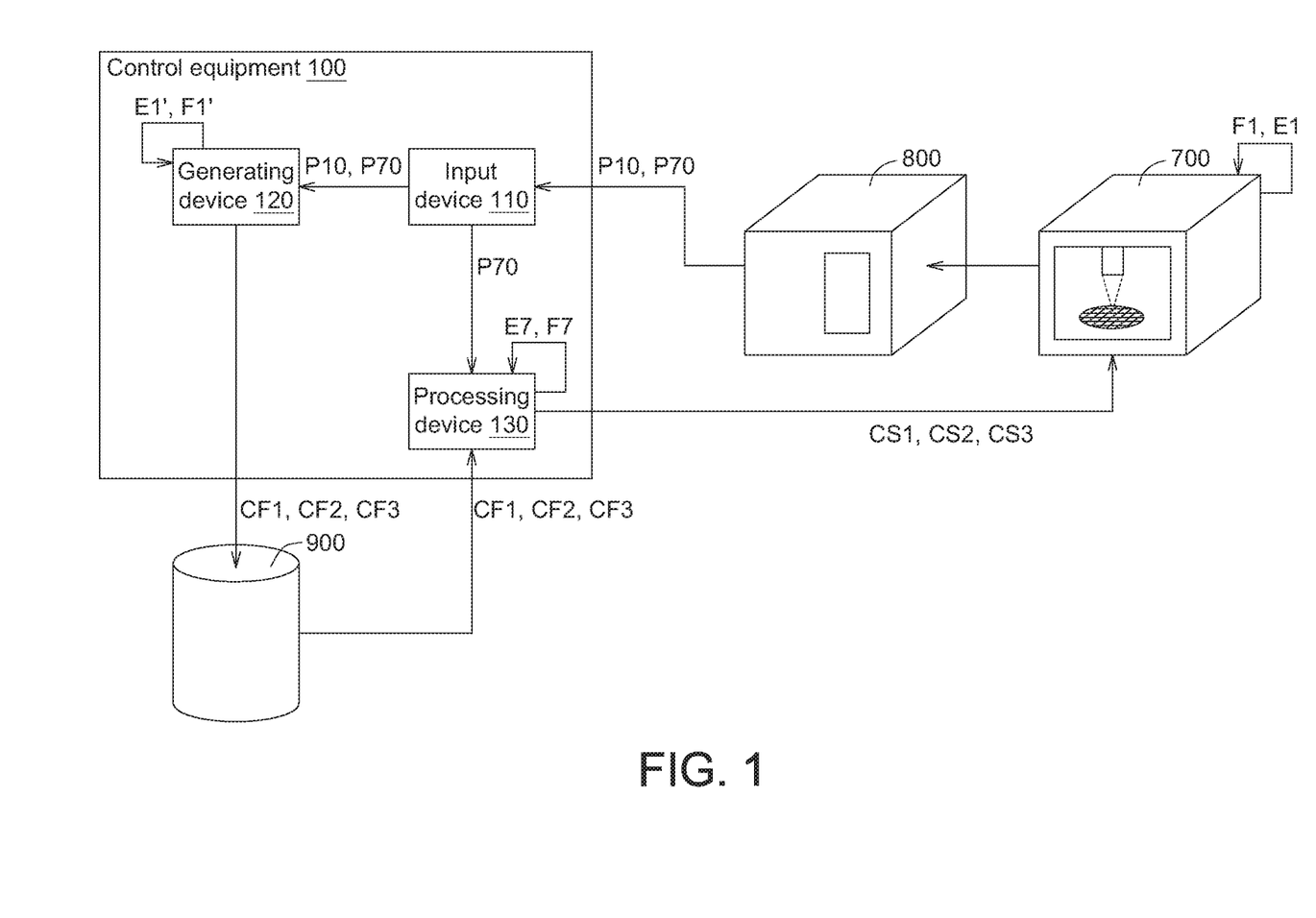
FIG. 1 is a schematic diagram of a control equipment of a stepper according to an embodiment.

Referring to FIG. 1, a schematic diagram of a control equipment 100 of a stepper 700 according to an embodiment is shown. The control equipment 100 includes an input device 110, a generating device 120 and a processing device 130. The input device 110 is configured to input various types of data, and can be realized by such as a wired network connection, a wireless network transceiver module, a transmission line, or a USB port. The generating device 120 is configured to perform various training/generating procedures. The processing device 130 is configured to perform various processing/analyzing procedures. The generating device 120 and the processing device 130 can be realized by such as a circuit, a circuit board, a chip, a plurality of programming codes or a recording device for storing programming codes.

In the present embodiment, after the stepper 700 exposes and develops the photoresist layer on the production line, the scanning electron microscope (SEM) 800 captures and inputs an online development pattern P70 to the control equipment 100. The control equipment 100 can analyze the online development pattern P70 to obtain an estimated focal length value F7 by using the artificial intelligence technology. Thus, the beam focal length of the stepper 700 can be calibrated according to the estimated focal length value F7, such that the beam of the stepper 700 can be precisely focused on the photoresist layer and the precision of the stepper 700 can be increased. The operations of each element disclosed above are described below with accompanying flowcharts.

Figure 2:
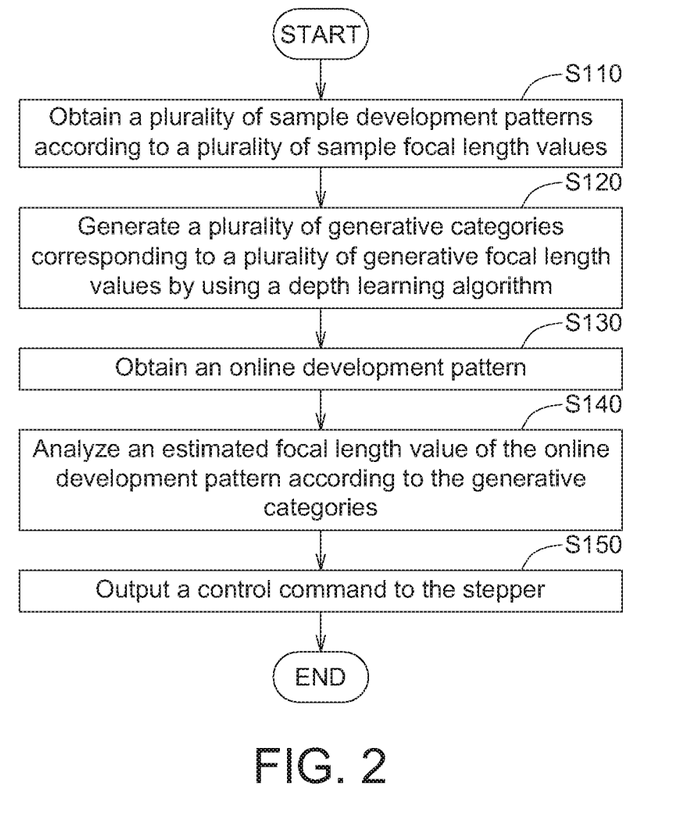
FIG. 2 is a flowchart of a control method of the stepper according to an embodiment.
Figure 3:
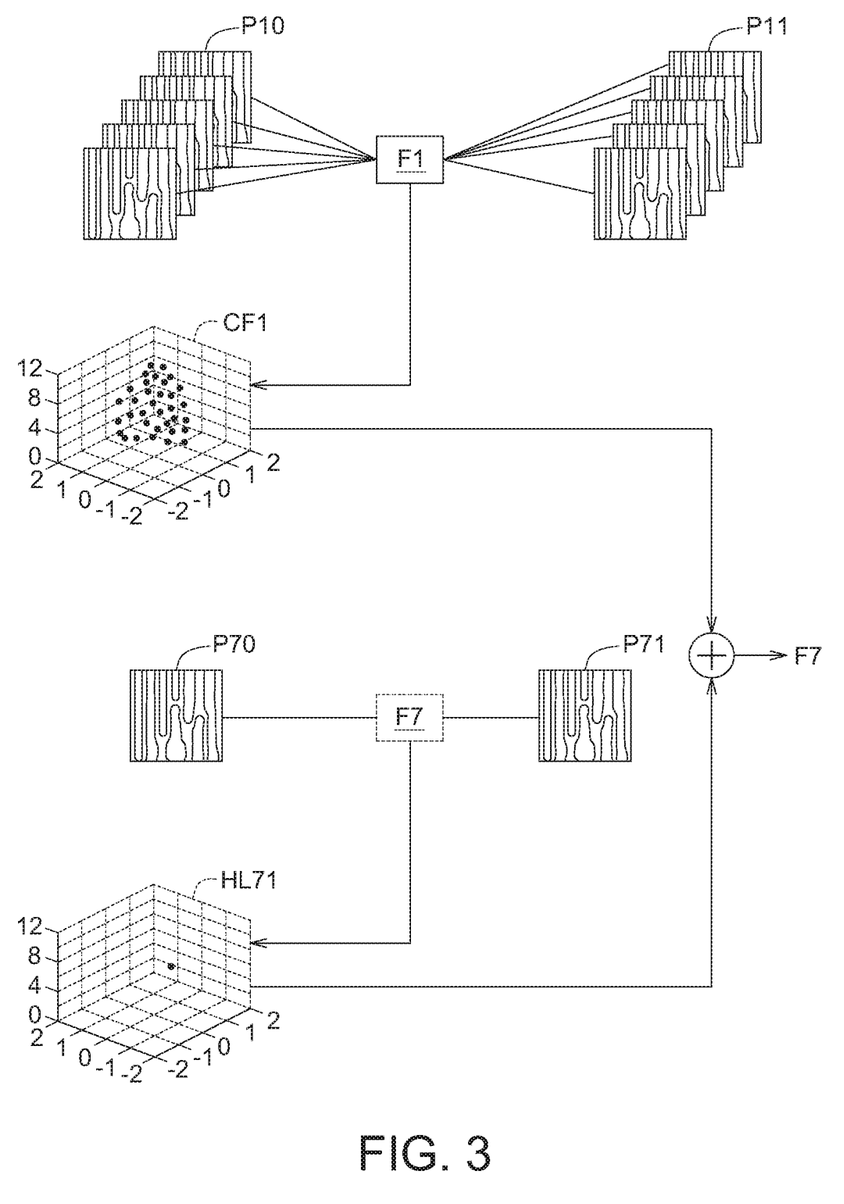
FIG. 3 is a schematic diagram of each step of FIG. 2.

Refer to FIG. 2 and FIG. 3. FIG. 2 is a flowchart of a control method of the stepper 700 according to an embodiment. FIG. 3 is a schematic diagram of each step of FIG. 2. First, the method begins at step S110, a plurality of sample development patterns P10 are obtained according to a plurality of sample focal length values F1 (illustrated in FIG. 3) by the input device 110. The sample focal length values F1 are set by the stepper 700, and different sample development patterns P10 can be obtained according to different sample focal length values F1. The sample development patterns P10 are obtained by the scanning electron microscope 800 by capturing the images of the photoresist layer which has been exposed and developed by the stepper 700. Since the stepper 700 has limited number of calibration scales with respect to the sample focal length values F1, the number of the sample development patterns P10 corresponding to the sample focal length values F1 is also limited.

Then, the method proceeds to step S120, a plurality of generative categories CF1 corresponding to a plurality of generative focal length values F1' are generated by the generating device 120 using a depth learning algorithm. The depth learning algorithm includes an auto-encoder algorithm and a generative adversarial network algorithm (GAN algorithm). As indicated in FIG. 3, in the present step, the sample development patterns P10 are converted into a plurality of encoded patterns P11 by using the auto-encoder algorithm and the generative adversarial network algorithm. During the process of generating the encoded patterns P11, the generative categories CF1 corresponding to different generative focal length values F1' are categorized and stored in a database 900.

That is, the generative focal length values F1' are not set by the stepper 700 but are generated by using the auto-encoder algorithm and the generative adversarial network algorithm. The scale of the generative focal length values F1' is finer than that of the sample focal length values F1. That is, the number of the generative focal length values F1' is larger than that of the sample focal length values F1.

For example, the setting of the stepper 700 is limited to 10 sets of sample focal length values F1, and only 10 sample development patterns P10 are obtained in step S110. In step S120, 100 generative categories CF1 corresponding to 100 generative focal length values F1' can be generated by the generating device 120.

Then, the method proceeds to step S130, a to-be-tested online development pattern P70 is obtained by the input device 110 operating on the production line. The online development pattern P70 is obtained by the scanning electron microscope 800 by capturing the images of the photoresist layer which has been exposed and developed by the stepper 700.

Then, the method proceeds to step S140, the estimated focal length value F7 of the online development pattern P70 is analyzed by the processing device 130 according to the generative category CF1. As indicated in FIG. 3, in the present step, the processing device 130 performs analysis according to the approximation between a hidden layer of the online development pattern P70 and a hidden layer of each generative category CF1. That is, the online development pattern P70 is converted into an encoded pattern P71 by using the encoder algorithm and the generative adversarial network algorithm, and during the conversion process, the characteristics of the hidden layer HL71 is compared with the characteristics of the hidden layer of the generative category CF1 to find a set of best approximated generative category CF1. After the set of best approximated generative category CF1 is obtained, its corresponding generative focal length value F1' is regarded as an estimated focal length value F7.

Then, the method proceeds to step S150, a control command CS1 is outputted to the stepper 700 by the processing device 130 according to the estimated focal length value F7 to calibrate the beam focal length of the stepper 700.

With the said artificial intelligence technology, the beam focal length of the stepper 700 can be calibrated to the most accurate value, such that the precision of the stepper 700 can be greatly increased.

Figure 4:
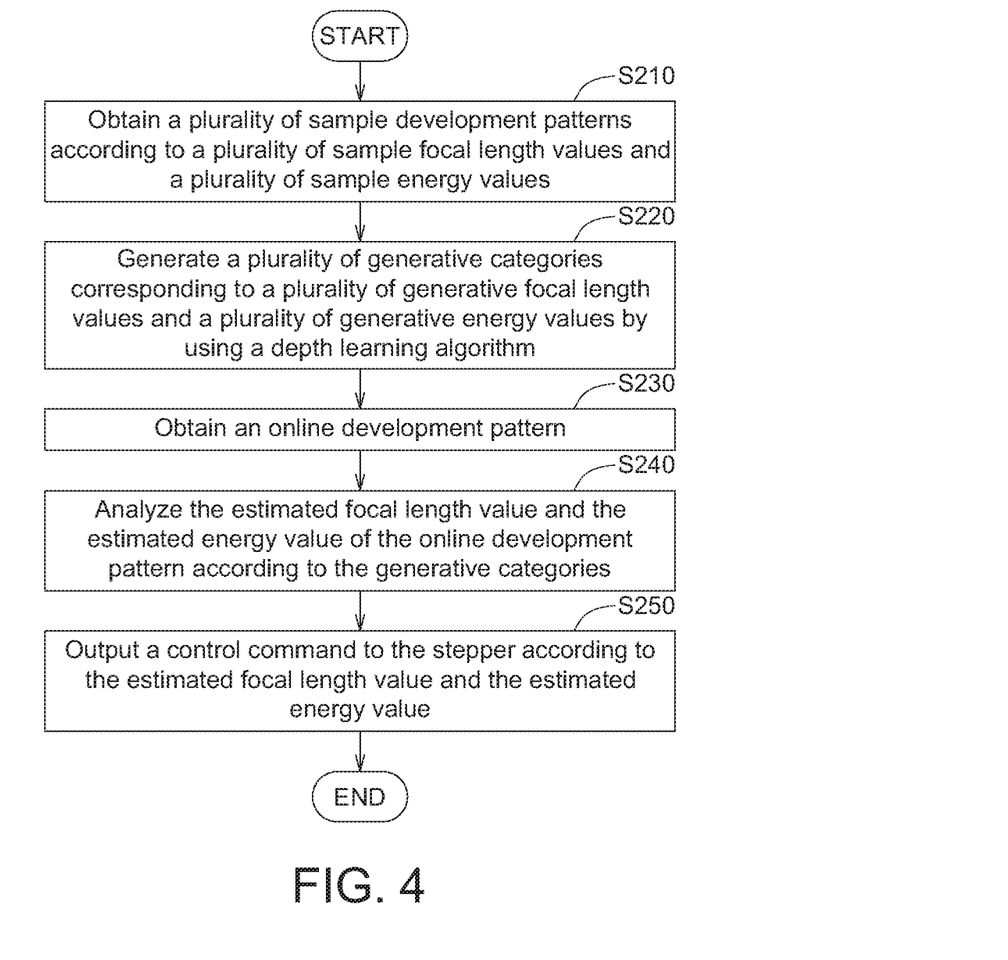
FIG. 4 is a flowchart of a control method of the stepper according to another embodiment.
Figure 5:
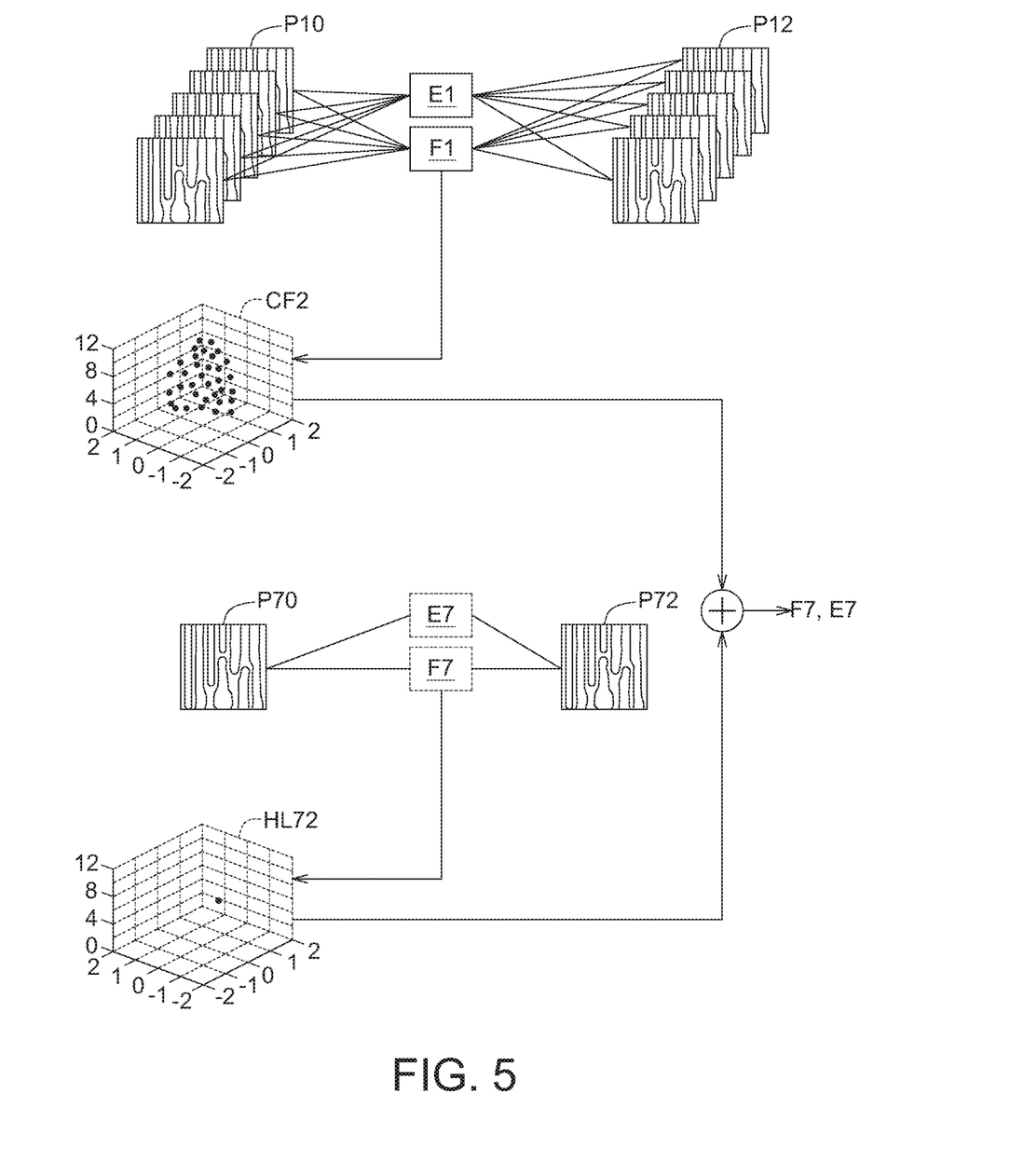
FIG. 5 is a schematic diagram of each step of FIG. 4.

Apart from calibrating the beam focal length of the stepper 700, the artificial intelligence technology of the present disclosure can be used to calibrate the exposure energy of the stepper 700 as well. Refer to FIG. 4 and FIG. 5. FIG. 4 is a flowchart of a control method of the stepper 700 according to another embodiment. FIG. 5 is a schematic diagram of each step of FIG. 4. First, the method begins at step S210, a plurality of sample development patterns P10 are obtained by the input device 110 according to a plurality of sample focal length values F1 and a plurality of sample energy values E1. The sample focal length values F1 and the sample energy values E1 are set by the stepper 700. Different sample development patterns P10 can be obtained according to different sample focal length values F1 and sample energy values E1. The sample focal length values F1 and the sample energy values E1 form a matrix. Since the stepper 700 has limited number of calibration scales with respect to the sample focal length values F1 and the sample energy values E1, the number of the sample development patterns P10 corresponding to the sample focal length values F1 and the sample energy values E1 are also limited.

Then, the method proceeds to step S220, a plurality of generative categories CF2 corresponding to a plurality of generative focal length values F1' and a plurality of generative energy values E1' are generated by the generating device 120 using a depth learning algorithm. In the present step, the sample development patterns P10 are converted into a plurality of encoded patterns P12 by using the auto-encoder algorithm and the generative adversarial network algorithm. During the process of generating the encoded patterns P12, a plurality of generative categories CF2 corresponding to the generative focal length values F1' and the generative energy values E1' are classified. That is, the generative focal length values F1' and the generative energy values E1' are not set by the stepper 700 but are generated by using the auto-encoder algorithm and the generative adversarial network algorithm. The scale of the generative focal length values F1' is finer than that of the sample focal length values F1. That is, the number of the generative focal length values F1' is larger than that of the sample focal length values F1. The scale of the generative energy values E1' is finer than that of the sample energy values E1. That is, the number of the generative energy values E1' is larger than that of the sample energy values E1.

For example, the setting of the stepper 700 is limited to 10 sets of sample focal length values F1 and 10 sets of sample energy value E1 (form a 10*10 matrix), and only 100 sample development patterns P10 can be obtained in step S210. In step S120, 10000 generative categories CF2 corresponding to 100 generative focal length values F1' and 100 sets of generative energy values E1' (form a 100*100 matrix) can be generated by the generating device 120.

Then, the method proceeds to step S230, a to-be-tested online development pattern P70 is obtained by the input device 110 operating on the production line. The online development pattern P70 is obtained by the scanning electron microscope 800 by capturing the images of the photoresist layer which has been exposed and developed by the stepper 700.

Then, the method proceeds to step S240, the estimated focal length value F7 and an estimated energy value E7 of the online development pattern P70 are analyzed by the processing device 130 according to the generative category CF2. As indicated in FIG. 5, in the present step, the processing device 130 performs analysis according to the approximation between a hidden layer of the online development pattern P70 and a hidden layer of each generative category CF2. That is, the online development pattern P70 is converted into an encoded pattern P72 by using the encoder algorithm and the generative adversarial network algorithm. During the process, the characteristics of the hidden layer HL72 is compared with the characteristics of the hidden layer of the generative category CF2 to find a set of best approximated generative category CF2. After the set of best approximated generative category CF2 is obtained, the generative focal length value F1' and the generative energy value E1' corresponding to the set of best approximated generative category CF2 are regarded as the estimated focal length value F7 and the estimated energy value E7.

Then, the method proceeds to step S250, the control command CS2 is outputted to the stepper 700 by the processing device 130 according to the estimated focal length value F7 and the estimated energy value E7 to calibrate the beam focal length and the exposure energy of the stepper 700.

With the artificial intelligence technology, the beam focal length and the exposure energy of the stepper 700 can be calibrated to the most accurate value, such that the precision of the stepper 700 can be greatly increased.

Figure 6:
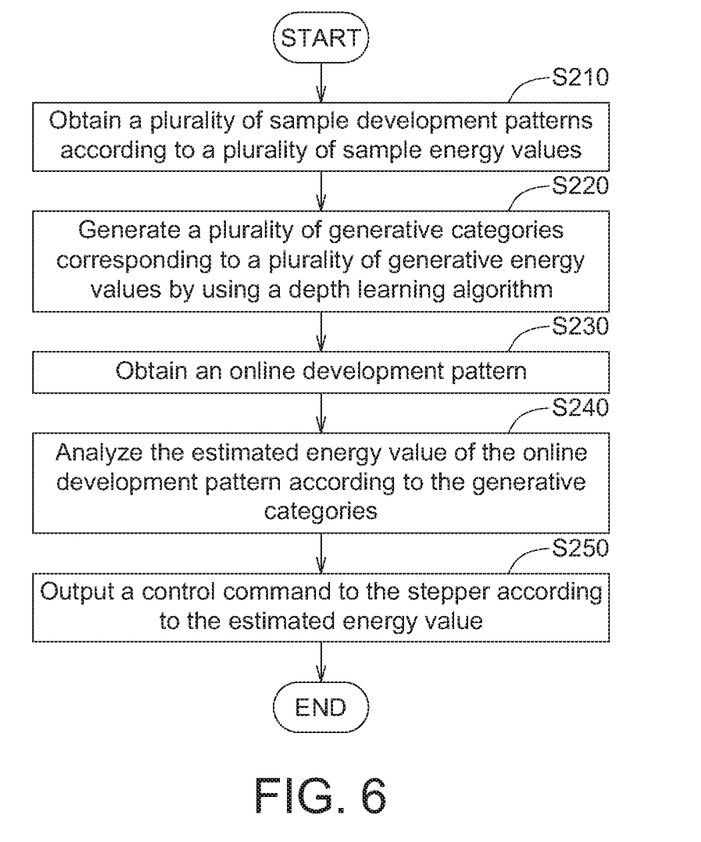
FIG. 6 is a flowchart of a control method of the stepper according to another embodiment.
Figure 7:
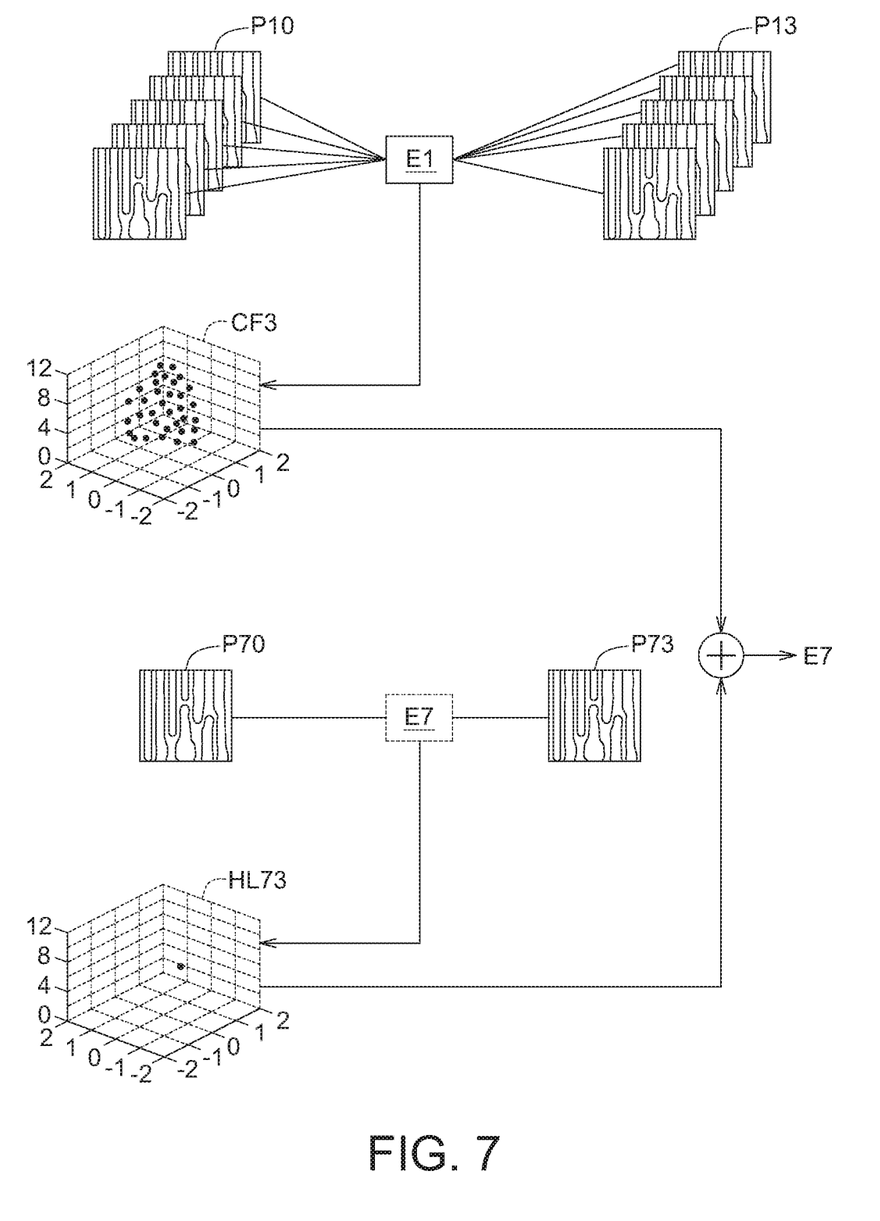
FIG. 7 is a schematic diagram of each step of FIG. 6.

Besides, the artificial intelligence technology of the present disclosure can be used to calibrate the exposure energy of the stepper 700 only. Refer to FIG. 6 and FIG. 7. FIG. 6 is a flowchart of a control method of the stepper 700 according to another embodiment. FIG. 7 is a schematic diagram of each step of FIG. 6. Firstly, the method begins at step S310, a plurality of sample development patterns P10 are obtained by the input device 110 according to a plurality of sample energy values E1. The sample energy values E1 are pre-set by the stepper 700, and different sample development patterns P10 can be obtained according to different sample energy values E1. Since the stepper 700 has limited number of calibration scales with respect to the sample energy value E1, the number of the sample development patterns P10 corresponding to the sample energy value E1 is also limited Then, the method proceeds to step S320, a plurality of generative categories CF3 corresponding to a plurality of generative energy values E1' are generated by the generating device 120 using a depth learning algorithm. In the present step, the sample development patterns P10 are converted into a plurality of encoded patterns P13 by using an auto-encoder algorithm and a generative adversarial network algorithm. During the process of generating encoded patterns P13, a plurality of generative categories CF3 corresponding to the generative energy values E1' are classified. That is, the generative energy values E1' are not set by the stepper 700 but are generated by using the auto-encoder algorithm and the generative adversarial network algorithm. The scale of the generative energy values E1' is finer than that of the sample energy values E1. That is, the number of the generative energy values E1' is larger than that of the sample energy values E1.

For example, the setting of the stepper 700 is limited to 10 sets of sample energy values E1, and only 10 sample development patterns P10 can be obtained in step S310. In step S320, 100 generative categories CF3 corresponding to 100 sets of generative energy values E1' can be generated by the generating device 120.

In step S330, a to-be-tested online development pattern P70 is obtained by the input device 110 operating on the production line. The online development pattern P70 is obtained by the scanning electron microscope 800 by capturing the images of the photoresist layer which has been exposed and developed by the stepper 700.

Then, the method proceeds to step S340, the estimated energy value E7 of the online development pattern P70 is analyzed by the processing device 130 according to the generative category CF3. As indicated in FIG. 5, in the present step, the processing device 130 performs analysis according to the approximation between a hidden layer of the online development pattern P70 and a hidden layer of each generative category CF3. That is, the online development pattern P70 is converted into an encoded pattern P73 by using the encoder algorithm and the generative adversarial network algorithm. During the process, the characteristics of the hidden layer HL73 is compared with the characteristics of the hidden layer of the generative category CF3 to find a set of best approximated generative category CF3. After the set of best approximated generative category CF3 is obtained, the generative energy value E1' corresponding to the set of best approximated generative category CF3 is regarded as an estimated energy value E7.

Then, the method proceeds to step S350, the control command CS3 is outputted to the stepper 700 by the processing device 130 according to the estimated energy value E7 to calibrate the beam focal length and the exposure energy of the stepper 700.

With the artificial intelligence technology, the exposure energy of the stepper 700 can be calibrated to the most accurate value, such that the precision of the stepper 700 can be greatly increased.

While the invention has been described by way of example and in terms of the preferred embodiment(s), it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A control equipment of a stepper, comprising:
an input device configured to input a plurality of sample development patterns from a scanning electron microscope connected to the stepper, wherein the sample development patterns are obtained according to a plurality of sample focal length values;
a generating device configured to generate a plurality of generative categories corresponding to a plurality of generative focal length values according to the sample development patterns inputted from the input device by using a depth learning algorithm, wherein the generative focal length values are different from the sample focal length values; and
a processing device configured to analyze an estimated focal length value of an online development pattern according to the generative categories generated from the generating device.

2. The control equipment of the stepper according to claim 1, wherein the sample development patterns are obtained according to the sample focal length values and a plurality of sample energy values.

3. The control equipment of the stepper according to claim 2, wherein the sample focal length values and the sample energy values form a matrix.

4. The control equipment of the stepper according to claim 1, wherein the generative categories correspond to the sample focal length values and a plurality of generative energy values.

5. The control equipment of the stepper according to claim 4, wherein the number of the generative energy values is larger than that of the sample energy values.

6. The control equipment of the stepper according to claim 5, wherein the processing device further analyzes an estimated energy value of the online development pattern according to the generative categories.

7. The control equipment of the stepper according to claim 1, wherein the depth learning algorithm comprises an auto-encoder algorithm.

8. The control equipment of the stepper according to claim 1, wherein the depth learning algorithm comprises a generative adversarial network algorithm (GAN algorithm).

9. The control equipment of the stepper according to claim 1, wherein the number of the generative focal length values is larger than that of the sample focal length values.

10. The control equipment of the stepper according to claim 1, wherein the processing device performs analysis according to an approximation between a hidden layer of the online development pattern and a hidden layer of each of the generative categories.

11. A control method of a stepper, comprising:
obtaining a plurality of sample development patterns from a scanning electron microscope connected to the stepper according to a plurality of sample focal length values;
generating a plurality of generative categories corresponding to a plurality of generative focal length values according to the sample development patterns inputted from the input device by using a depth learning algorithm, wherein the generative focal length values are different from the sample focal length values;
obtaining an online development pattern; and
analyzing an estimated focal length value of the online development pattern according to the generative categories generated from the generating device.

12. The control method of the stepper according to claim 11, wherein in the step of obtaining the sample development patterns according to the sample focal length values, the sample development patterns are obtained according to the sample focal length values and a plurality of sample energy values.

13. The control method of the stepper according to claim 12, wherein the sample focal length values and the sample energy values form a matrix.

14. The control method of the stepper according to claim 12, wherein in the step of generating the generative categories corresponding to the generative focal length values by using the depth learning algorithm, the generative categories correspond to the generative focal length values and a plurality of generative energy values.

15. The control method of the stepper according to claim 14, wherein the number of the generative energy values is larger than that of the sample energy values.

16. The control method of the stepper according to claim 15, wherein in the step of analyzing the estimated focal length value of the online development pattern according to the generative categories, an estimated energy value of the online development pattern is analyzed.

17. The control method of the stepper according to claim 11, wherein in the step of generating the generative categories corresponding to the generative focal length values by using the depth learning algorithm, the depth learning algorithm comprises an auto-encoder algorithm.

18. The control method of the stepper according to claim 11, wherein in the step of generating the generative categories corresponding to the generative focal length values by using the depth learning algorithm, the depth learning algorithm comprises a generative adversarial network algorithm (GAN algorithm).

19. The control method of the stepper according to claim 11, wherein the number of the generative focal length values is larger than that of the sample focal length values.

20. The control method of the stepper according to claim 11, wherein in the step of analyzing the estimated focal length value of the online development pattern according to the generative categories, analysis is performed according to the approximation between a hidden layer of the online development pattern and a hidden layer of each of the generative categories.

* * * * *